United States Patent
Hwang et al.

(10) Patent No.: US 6,338,995 B1
(45) Date of Patent: Jan. 15, 2002

(54) HIGH-PERMITTIVITY DIELECTRIC CAPACITOR FOR A SEMICONDUCTOR DEVICE AND METHOD FOR FABRICATING THE SAME

(75) Inventors: Chul Ju Hwang, Songnam-shi; Ki Bum Kim, Seoul, both of (KR)

(73) Assignee: Jusung Engineering Co., Ltd. (KR)

( * ) Notice: Subject to any disclaimer, the term of this patent is extended or adjusted under 35 U.S.C. 154(b) by 0 days.

(21) Appl. No.: 09/368,210

(22) Filed: Aug. 4, 1999

(30) Foreign Application Priority Data

Aug. 4, 1998 (KR) .............................. 98-31766

(51) Int. Cl.[7] ......................................... H01L 21/8242
(52) U.S. Cl. ........................................ 438/240; 438/396
(58) Field of Search ................................ 257/306, 309, 257/310, 55, 295; 438/396, 397, 240

(56) References Cited

U.S. PATENT DOCUMENTS

| 4,897,709 A | * | 1/1990 | Yokoyama et al. | ........... 357/68 |
|---|---|---|---|---|
| 5,569,619 A | | 10/1996 | Roh | .............................. 437/52 |
| 5,763,300 A | | 6/1998 | Park et al. | ................... 438/240 |
| 5,876,503 A | * | 3/1999 | Roeder et al. | .............. 118/715 |
| 6,075,691 A | * | 6/2000 | Duenas et al. | ........... 361/321.5 |
| 6,107,155 A | * | 8/2000 | Hsiao et al. | ................. 438/397 |

* cited by examiner

*Primary Examiner*—David Nelms
*Assistant Examiner*—David Vu
(74) *Attorney, Agent, or Firm*—Marger Johnson & McCollom, P.C.

(57) ABSTRACT

A high-permittivity dielectric capacitor and a fabrication method thereof are provided. The capacitor uses a tantalum oxynitride film as a high-permittivity dielectric film. The tantalum oxynitride film is deposited by chemical vapor deposition using tantalum ethoxide gas as a source of tantalum and oxygen and ammonia gas as a source of nitrogen. The tantalum oxynitride film has a high permittivity, a high thermal stability and a low interface heterogeneity between upper and lower electrodes. Thus, the current leakage due to oxygen vacancy in the film can be reduced.

3 Claims, 2 Drawing Sheets

HIGH-PERMITTIVITY DIELECTRIC CAPACITOR FOR A SEMICONDUCTOR DEVICE AND METHOD FOR FABRICATING THE SAME

BACKGROUND OF THE INVENTION

1. Field of the Invention

The present invention relates to a capacitor for a semiconductor device and a fabricating method thereof, and more particularly, to a capacitor using a tantalum oxynitride (TaON) film as a high-permittivity dielectric film, and a fabricating method thereof.

2. Description of the Prior Art

As the overall dimensions of semiconductor devices continue to shrink, the demand is ever increasing for devices having large charge storage capacity. The need for large charge storage capacity remains even though individual components are scaled to smaller dimensions. As the surface area of a component, such as a capacitor, is reduced, a corresponding reduction in charge storage capability occurs. The smaller surface area available for components, such as transistors, capacitors, and the like, coupled with the requirement to maintain high charge storage levels, has led researchers in the field of fabrication science to seek new materials from which to construct the components. One group of promising new dielectric materials is the family of high-permittivity ferroelectric materials such as tantalum pentoxide ($Ta_2O_5$), BST (($Ba,Sr$)$TiO_3$), or PZT ($Pb(Zr_{1-x}Ti_x)O_3$).

While the ferroelectric materials offer a substantial improvement in compact charge storage capability, the use of the ferroelectric components in MOS integrated circuit technology has been limited by the physical and chemical characteristics of the ferroelectric materials. For example, stoichiometrically the $Ta_2O_5$ film frequently runs short of oxygen, resulting in permittivity degradation and undesired leakage current characteristics. Moreover, the $Ta_2O_5$ film has a bad interface characteristic with a polysilicon film or a metal nitride film commonly used as an upper electrode, and is in a high intrinsic stress state, thus remaining many problems to be solved.

The high-permittivity dielectric capacitor using such a $Ta_2O_5$ film is generally fabricated by the following process.

First, a lower electrode is formed on an insulating layer overlying a semiconductor substrate. Next, a $Ta_2O_5$ film is formed on the lower electrode by thermally decomposing tantalum ethoxide $Ta(OC_2H_5)_5$, a tantalum source gas, in an oxygen atmosphere. In order to remove oxygen vacancy which may exist in the $Ta_2O_5$ film, a post baking process is performed using ultraviolet (UV)—$O_3$, or thermal treatment is performed in an oxygen atmosphere using $O_2$, $N_2O$, or $O_3$ gas. Thereafter, an upper electrode is formed on the $Ta_2O_5$ film by chemical vapor deposition (CVD) or sputtering.

However, there are several drawbacks associated with the $Ta_2O_5$ film although $Ta_2O_5$ material has inherently higher dielectric properties.

First, when the $Ta_2O_5$ film is deposited, the stoichiometrical shortage of oxygen becomes severe by residual gases or byproducts, resulting in undesired leakage current increase.

Second, when post-thermal treatment is performed in an oxygen atmosphere and at a temperature of 800° C. or more, gases are overflowed, and thus an amorphous $Ta_2O_5$ film is crystallized into a columnar structure. At this time, oxygen diffuses quickly along grain boundaries, and a silicon oxynitride (SiON) film is thus thickly formed between a polysilicon layer and a $Ta_2O_5$ film in the case of using a polysilicon layer as a lower electrode. This adversely effects the realization of high capacitance promised by the $Ta_2O_5$ film.

Third, in the case of using a titanium nitride (TiN) film as an upper electrode of a capacitor, an interface reaction occurs between the $Ta_2O_5$ film and the TiN film at a temperature of 500° C., so that oxygen within the $Ta_2O_5$ film diffuses into the TiN film. Thus, the stoichiometrical shortage of oxygen is accelerated.

SUMMARY OF THE INVENTION

To solve the above problems, it is an object of the present invention to provide a high-permittivity dielectric capacitor with an enhanced film characteristics compared with conventional dielectric films.

It is another object of the present invention to provide a method of fabricating a capacitor for a semiconductor device that adopts a new dielectric material.

It is still another object of the present invention to provide a method of fabricating a capacitor for a semiconductor device by which interface heterogeniety between upper and lower electrodes is small, and current leakage due to oxygen vacancy is reduced.

Accordingly, to achieve the first object, there is provided a capacitor characterized in that a tantalum oxynitride (TaON) film is used as a high-permittivity dielectric material. Preferably, the tantalum oxynitride is formed to a thickness of 10 to 500 Å.

To achieve the second and third objects, there is provided a method of fabricating a capacitor for use in a semiconductor device, characterized in that a tantalum oxynitride film is formed as a dielectric film on a lower electrode using chemical vapor deposition. In depositing the tantalum oxynitride film, tantalum ethoxide gas is used as a source of tantalum and oxygen, and ammonia gas is used as a source of nitrogen. The conditions of the CVD process are as follows.

Tantalum ethoxide gas is supplied at a flow rate of 0.01 sccm (standard cubic centimeters per minute) to 1 slm (standard liter per minute), and the ammonia gas is supplied at a flow rate of 10 sccm to 10 slm to the CVD reactor, respectively. The base pressure and the deposition pressure of the reactor are preferably set to be $1 \times 10^{-3}$ Torr or less, and between 1 mTorr and 100 Torr, respectively. The deposition temperature in the reactor is set to be between 150° C. and 900° C.

Hydrogen gas can be further supplied to activate decomposition of source gases in the step of chemical vapor depositing the tantalum oxynitride film.

Alternatively, plasma treatment can be further carried out with plasma power of 10 W to 3 kW to activate decomposition of the tantalum ethoxide gas.

BRIEF DESCRIPTION OF THE DRAWINGS

FIGS. 2A to 2D are cross sectional views of a capacitor fabricated according to the embodiment of the present invention.

DESCRIPTION OF THE PREFERRED EMBODIMENT

Figure 1:
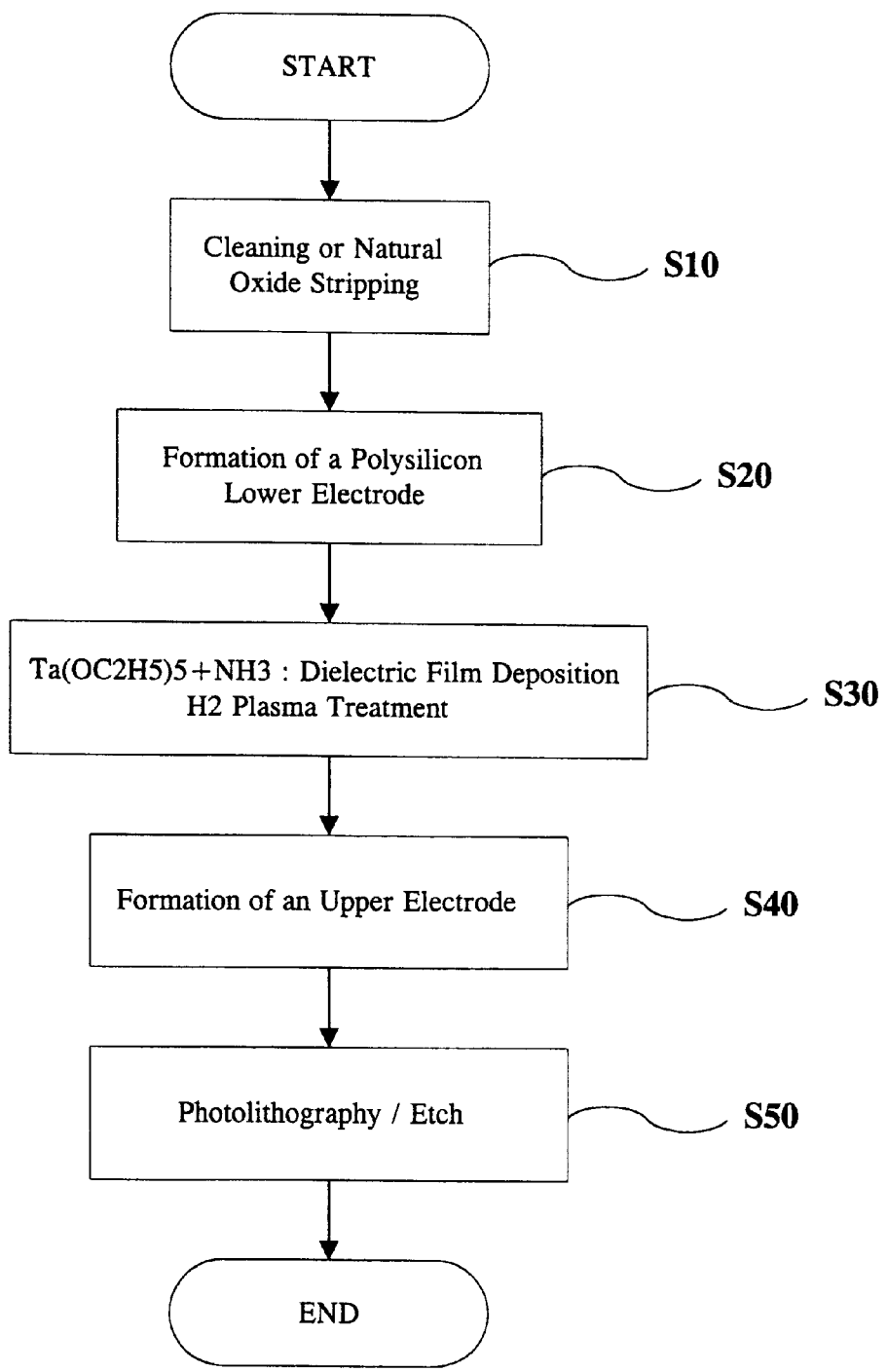
FIG. 1 is a flowchart illustrating a process sequence for fabricating a capacitor for a semiconductor device according to an embodiment of the present invention.

Referring to FIG. 1, a polysilicon lower electrode is formed on an insulating layer overlying a semiconductor substrate in step S20. Prior to the formation of the lower electrode, a process such as cleaning or natural oxide layer stripping is performed on the insulating layer in step S10. Thereafter, a tantalum oxynitride film is formed as a dielectric film on the polysilicon lower electrode in step S30. In step S30, tantalum ethoxide gas as a source of both tantalum and oxygen is supplied to the reactor of chemical vapor deposition equipment. Ammonia gas is also supplied to the reactor as a nitrogen source.

Tantalum ethoxide is a liquid at a room temperature, and has physical properties of molecular weight 406.26 g/mol and boiling point 140° C. at 0.1 mmHg pressure.

In the present invention, a silicon wafer on which the polysilicon lower electrode is deposited is loaded in the reactor of plasma CVD equipment. And then, a tantalum oxynitride film is deposited using tantalum ethoxide and ammonia as reaction gases. In the CVD process, the tantalum ethoxide gas and the ammonia gas are supplied to the reactor of the CVD equipment at flow rates of 0.1 sccm and 100 sccm, respectively. The base pressure and the deposition pressure are respectively set to be $1.2 \times 10^{-3}$ Torr and 1.5 mTorr. The deposition temperature in the reactor is set to be 600° C.

While depositing the tantalum oxynitride film, hydrogen gas is supplied to the reactor together with the tantalum ethoxide and ammonia reaction gases so as to activate the decomposition of the reaction gases.

In the present embodiment, hydrogen plasma treatment is further carried out by supplying electrical power to the plasma electrodes of the plasma CVD equipment. Preferably, the plasma power is set between 10 W and 3 kW, and the flow rate of the hydrogen gas is set between 10 sccm and 10 slm.

When deposition of the tantalum oxynitride film is completed, an upper electrode such as a TiN film is formed on the tantalum oxynitride film in step S40.

After formation of the upper electrode, the capacitor for a semiconductor device is completely fabricated by a photolithography process and a subsequent etching process in step S50.

Figure 2A:
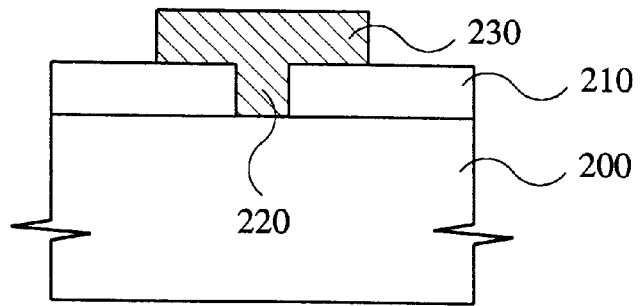

Referring to FIG. 2A, an insulating layer 210 is formed over a silicon substrate 200 having a transistor structure (not shown) thereon. Thereafter, a contact hole 220 is formed in the insulating layer 210, exposing the surface of the substrate 200. After the formation of the contact hole 220, a natural oxide layer on the surface of the contact hole 220 is stripped by etching. Then, a polysilicon layer is deposited on the insulating layer 210 to fill the contact hole 220, and is etched to form a polysilicon lower electrode 230.

Figure 2B:
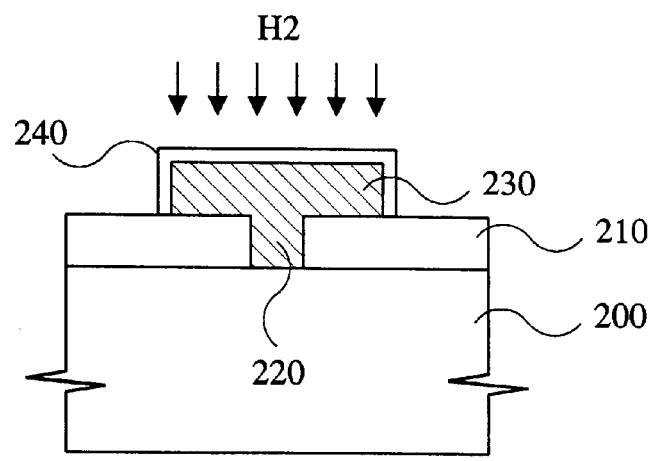

Referring to FIG. 2B, a tantalum oxynitride film 240 is formed on the polysilicon lower electrode 230 using chemical vapor deposition, as described above. Both tantalum ethoxide gas and ammonia gas are used as source gases. During the deposition process, hydrogen plasma treatment is carried out, which is denoted by arrows in FIG. 2B.

Figure 2C:
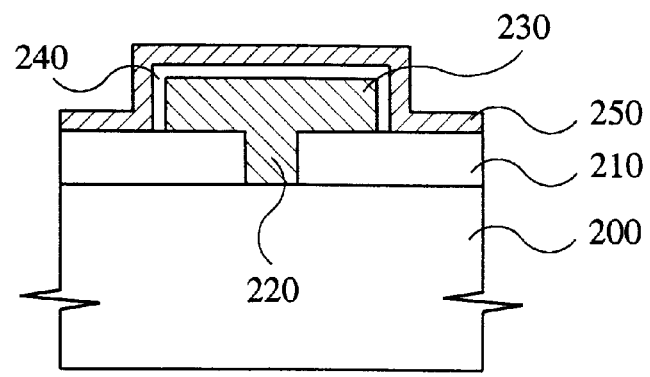

An upper electrode 250 is then formed using conventional upper electrode forming steps to thereby complete the capacitor as shown in FIG. 2C.

According to the present invention, a tantalum oxynitride film is used as a high permittivity dielectric material, instead of a $Ta_2O_5$ film. The tantalum oxynitride film provides the following superior film properties to conventional high permittivity dielectric films for use in a semiconductor device.

The tantalum oxynitride film has a high thermal stability, such that a capacitor can be formed in which the interface heterogeniety between upper and lower electrodes is small, and current leakage due to oxygen vacancy is reduced.

What is claimed is:

1. A method for fabricating a high-permittivity dielectric capacitor for use in a semiconductor device, comprising the steps of:

providing a semiconductor substrate and an insulating layer, wherein the insulating layer lies over the semiconductor substrate;

forming a first electrode on the insulating layer;

chemical vapor depositing a tantalum oxynitride film as a high-permittivity dielectric film on the first electrode in a reactor, wherein tantalum ethoxide gas as a source of tantalum and oxygen is supplied to the reactor at a flow rate of 0.01 sccm to 1 slm, ammonia gas as a source of nitrogen is supplied to the reactor at a flow rate of 10 sccm to 10 slm, a base pressure and a deposition pressure are respectively set to be $1 \times 10^{-3}$ Torr or less and between 1 mTorr and 100 Torr, and a deposition temperature is set to be between 150° C. and 900° C. in the reactor; and forming a second electrode overlying the tantalum oxynitride film.

2. The method of claim 1, wherein hydrogen gas is further supplied to activate decomposition of source gases in the step of chemical vapor depositing the tantalum oxynitride film.

3. The method of claim 1, wherein plasma treatment is further carried out with plasma power of 10 W to 3 kW to activate decomposition of the tantalum ethoxide gas in the step of chemical vapor depositing the tantalum oxynitride film.

* * * * *